(12) United States Patent
Oshima

(10) Patent No.: US 7,906,412 B2  
(45) Date of Patent: Mar. 15, 2011

(54) METHOD OF FABRICATING GROUP III NITRIDE SEMICONDUCTOR SINGLE CRYSTAL, AND METHOD OF FABRICATING GROUP III NITRIDE SEMICONDUCTOR SINGLE CRYSTAL SUBSTRATE

(75) Inventor: Yuichi Oshima, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 25 days.

(21) Appl. No.: 12/457,552

(22) Filed: Jun. 15, 2009

(65) Prior Publication Data  
US 2010/0233870 A1 Sep. 16, 2010

(30) Foreign Application Priority Data

Mar. 11, 2009 (JP) .................................. 2009-057375

(51) Int. Cl.  
*H01L 21/20* (2006.01)
(52) U.S. Cl. .................................. 438/478; 257/E21.09
(58) Field of Classification Search .................. 438/478; 257/E21.09  
See application file for complete search history.

(56) References Cited

U.S. PATENT DOCUMENTS

| 6,667,184 B2* | 12/2003 | Motoki et al. | 438/22 |
| 2004/0211355 A1* | 10/2004 | Motoki et al. | 117/19 |
| 2007/0266928 A1* | 11/2007 | Iwata et al. | 117/3 |
| 2009/0056618 A1* | 3/2009 | Yoshida | 117/84 |

FOREIGN PATENT DOCUMENTS

JP 2007-314357 12/2007

OTHER PUBLICATIONS

S. Kubo et al. (2008) "Bulk GaN crystals grown by HVPE", 2nd International Symposium on Growth of III-Nitrides, Presentation No. I-TU-5.

* cited by examiner

*Primary Examiner* — Walter L Lindsay, Jr.  
*Assistant Examiner* — Stanetta D Isaac  
(74) *Attorney, Agent, or Firm* — McGinn IP Law Group, PLLC

(57) ABSTRACT

A method of fabricating a group III nitride semiconductor single crystal includes preparing a seed substrate which includes group III nitride semiconductor and has a crystal growth face of single index plane, and epitaxially growing the group III nitride semiconductor single crystal on the crystal growth face, wherein the group III nitride semiconductor single crystal is epitaxially grown while being surrounded by a plurality of crystal surfaces including low-index planes spontaneously formed, and the low-index planes have a structure that each of plane indices showing a crystal plane is not more than 3.

14 Claims, 10 Drawing Sheets

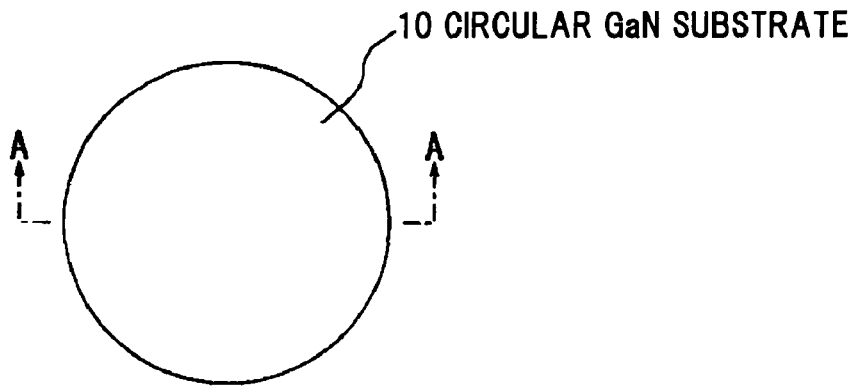
FIG.2A
FIG.2B
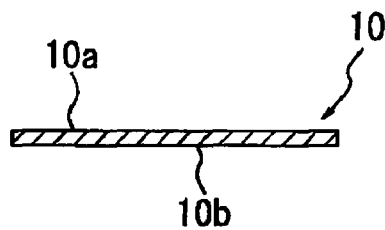
FIG.2C
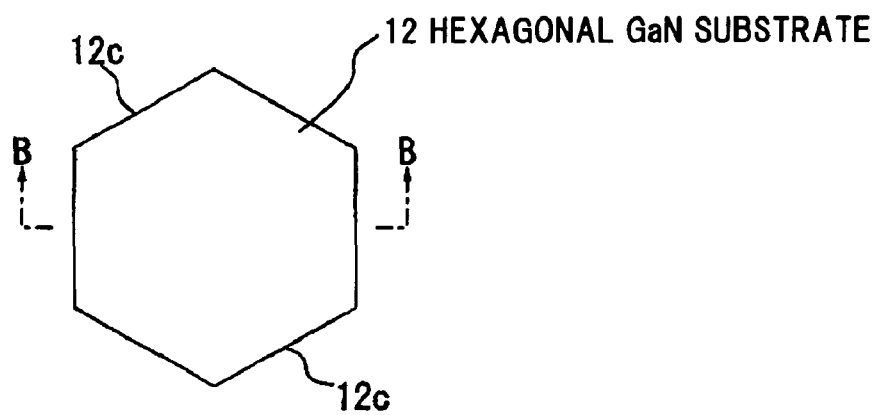
FIG.2D
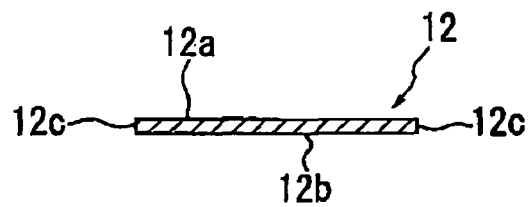

METHOD OF FABRICATING GROUP III NITRIDE SEMICONDUCTOR SINGLE CRYSTAL, AND METHOD OF FABRICATING GROUP III NITRIDE SEMICONDUCTOR SINGLE CRYSTAL SUBSTRATE

The present application is based on Japanese patent application No. 2009-057375 filed Mar. 11, 2009, the entire contents of which are incorporated herein by reference.

BACKGROUND OF THE INVENTION

1. Field of the Invention

This invention relates to a method of fabricating a group III nitride semiconductor single crystal, and a method of fabricating a group III nitride semiconductor single crystal substrate. Particularly, the invention relates to a method of fabricating a high-quality group III nitride semiconductor single crystal, and a method of fabricating a group III nitride semiconductor single crystal substrate.

2. Description of the Related Art

Conventionally, a method of fabricating a plurality of gallium nitride (GaN) substrates by a high speed growth or a multiple growth of the GaN, or a method of cutting out a plurality of the GaN substrates by growing a thick bulk ingot and cutting the grown bulk ingot (hereinafter referred to as "bulk method") and the like are investigated. The bulk method is an expected technique in terms of being capable of fabricating a substrate having C-face and crystal planes other than the C-face.

Further, as a method of fabricating GaN which uses seed crystals having a plurality of faces such as the C-face and crystal planes other than the C-face, a method of fabricating nitride semiconductor crystal is known, the method using seed crystals configured to have a structure that the surface has at least the C-face and the faces directly adjacent to the C-face are not M-face and not A-face (for example, refer to Patent Literature 1).

According to the method of fabricating nitride semiconductor crystal described in Patent Literature 1, since the seed crystals is ground by using a file and the like so as to have a result that the faces directly adjacent to the C-face are not M-face and not A-face, adhesion of polycrystal to a boundary line between the C-face and other faces can be avoided.

Further, it is known that a GaN ingot with no cracks having a thickness of almost 5.8 mm and a diameter of 2 inches in case of a relatively slow crystal growth speed of almost 100 μm/h can be fabricated by using Hydride Vapor Phase Epitaxy (HVPE) method (for example, refer to Non Patent Literature 1).

Patent Literature 1: JP-A-2007-314357

Non Patent Literature 1: S. Kubo et al. "Bulk GaN crystals grown by HVPE", $2^{nd}$ International Symposium on Growth of III-Nitrides (2008), publication number: I-Tu-5

However, in case of the method of fabricating nitride semiconductor crystal described in Patent Literature 1, at the first growth the adhesion of polycrystal to the boundary line between the C-face and other faces can not be avoided even if the ground seed crystals are used. Further, it is difficult to grind the seed crystals by using a file and the like while changing the grinding conditions in case of GaN being hard to be ground so as to have a result that the faces directly adjacent to the C-face are not M-face and not A-face, and simultaneously, mechanical damages may remain in the seed crystals by the grinding work. And, it is required that the grinding and the crystal growth using the seed crystals after the grinding are repeated, so that the production cost can not be reduced.

Further, in case of the technique described in Non Patent Literature 1, if the crystal growth is carried out at the crystal growth speed which is elevated higher than 100 μm/h, fine cracks occur in the GaN ingot grown and obtained, so that the surface of the GaN ingot obtained may be roughened.

SUMMARY OF THE INVENTION

Therefore, it is an object of the invention to solve the above-mentioned problem and provide a method of fabricating a group III nitride semiconductor single crystal that is capable of reducing occurrence of cracks in the crystal growth and fabricating the high quality group III nitride semiconductor single crystal at high speed and a method of fabricating group III nitride semiconductor single crystal substrate.

(1) According to one embodiment of the invention, a method of fabricating group III nitride semiconductor single crystal comprises:

preparing a seed substrate which comprises group III nitride semiconductor and has a crystal growth face of single index plane; and epitaxially growing group III nitride semiconductor single crystal on the crystal growth face, wherein the group III nitride semiconductor single crystal is epitaxially grown while being surrounded by a plurality of crystal surfaces comprising low-index planes spontaneously formed, and the low-index planes have a structure that each of plane indices showing a crystal plane is not more than 3.

In the above embodiment (1), the following modifications and changes can be made.

(i) The group III nitride semiconductor is a hexagonal nitride semiconductor, and the low-index plane has a structure that when the index plane is represented as {h k l m} where all of h, k, l and m are an integer number, each of absolute values of the h, k, l and m is not more than 3.

(ii) A plurality of the crystal surfaces do not comprise high-index planes having a structure that any one of the plane indices showing the crystal plane is not less than 4.

(iii) The group III nitride semiconductor single crystal having the maximum external diameter of not less than 15 mm is epitaxially grown.

(iv) The group III nitride semiconductor single crystal is epitaxially grown by not less than 5 mm along the crystal growth direction.

(v) The group III nitride semiconductor single crystal is epitaxially grown at the crystal growth speed of not less than 300 μm/h.

(vi) The seed substrate is prepared by that the periphery of the seed substrate is cleaved so that the seed substrate having sides parallel to the low-index plane is formed.

(vii) The seed substrate is prepared by that a mask is installed on the seed substrate so that the crystal growth face is limited to a part of the surface of the seed substrate.

(2) According to another embodiment of the invention, a method of fabricating group III nitride semiconductor single crystal substrate comprises:

cutting the group III nitride semiconductor single crystal fabricated by the method of fabricating group III nitride semiconductor single crystal according to any one of the above embodiment (1) and the modifications (i) to (vii) by a plane vertical to the crystal growth direction so as to obtain the group III nitride semiconductor single crystal substrates.

In the above embodiment (2), the following modification and change can be made.

(viii) The group III nitride semiconductor single crystal substrate has a quadrangular or hexagonal shape.

Points of the Invention

According to one embodiment of the invention, a method of fabricating a group III nitride semiconductor single crystal is conducted such that a seed substrate for growing an ingot of group III nitride semiconductor single crystal is cleaved or a mask is laminated so as to form the ingot surrounded by low-index planes on the seed substrate. Therefore, occurrence of fine cracks in the ingot obtained can be significantly reduced and the high-quality and long-size ingot can be obtained. In addition, a high-quality group III nitride semiconductor substrate can be obtained by cutting or slicing the ingot.

BRIEF DESCRIPTION OF THE DRAWINGS

The preferred embodiments according to the invention will be explained below referring to the drawings, wherein:

FIG. 2A is a plan view schematically showing a circular GaN substrate used in Example 1 according to the invention;

FIG. 2B is a transverse cross-sectional view taken along the line A-A in FIG. 2A;

FIG. 2C is a plan view schematically showing a hexagonal GaN substrate used in Example 1 according to the invention;

FIG. 2D is a transverse cross-sectional view taken along the line B-B in FIG. 2C;

DETAILED DESCRIPTION OF THE PREFERRED EMBODIMENTS

Method of Fabricating Group III Nitride Semiconductor Single Crystal

Figure 1A:
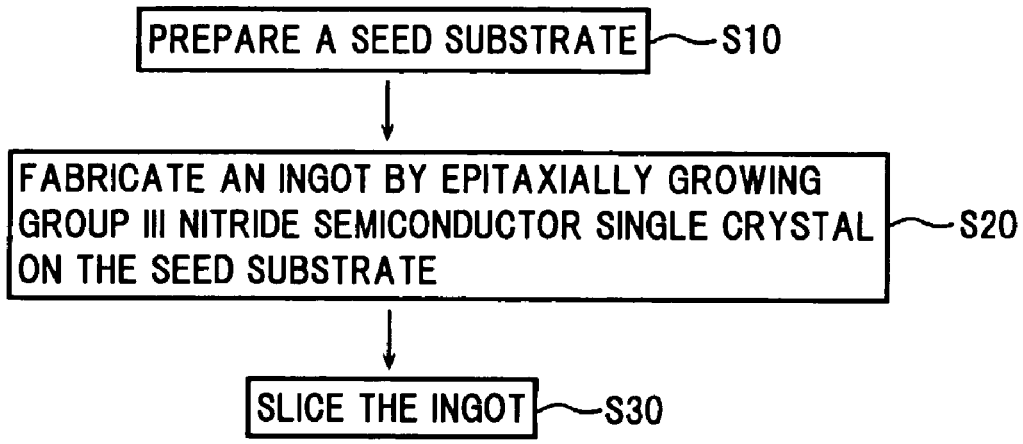
FIG. 1A is a flow chart schematically showing a flow of a method of fabricating a group III nitride semiconductor single crystal in one embodiment according to the invention.

FIG. 1A is a flow chart schematically showing a flow of a method of fabricating a group III nitride semiconductor single crystal in one embodiment according to the invention.

Step of Preparing Seed Substrate: Step 10 (Hereinafter Step is Referred to as "S")

First, a seed substrate made of a group III nitride semiconductor is prepared. The seed substrate according to the embodiment is a substrate that has a crystal growth face of substantially single index plane. For example, in case of epitaxially growing the group III nitride semiconductor on a seed substrate along a C-axis direction, a group III nitride semiconductor single crystal substrate having a C-face is used as the seed substrate. Further, in the embodiment, GaN which is a hexagonal nitride semiconductor will be explained as an example of the group III nitride semiconductor.

Particularly, in the embodiment, first a circular GaN substrate is prepared, and the periphery of the GaN substrate is cleaved so that a seed substrate having cleavage planes at the side surfaces is fabricated. Namely, due to the fact that the GaN substrate is cleaved, the seed substrate has a crystal growth face of a low-index plane, and simultaneously, the circumference of the crystal growth face has sides parallel to the low-index plane. And, a surface which is a main face of the seed substrate becomes a crystal growth face on which GaN is homoepitaxially grown. Further, the shape of seed substrate obtained by the cleavage of GaN substrate becomes a polygonal shape in which each side is parallel to the low-index plane.

And, instead of cleaving the GaN substrate, a mask having an opening of a predetermined shape can be laminated on the GaN substrate, and the GaN substrate in a state that the mask is laminated can be used as the seed substrate. In this case, the opening of the mask is formed so as to have a shape in which at least sides parallel to the low-index plane (except for the crystal growth face) of the GaN substrate is included. Further, due to the fact that the mask having the opening is laminated on the GaN substrate, GaN grows on a part of the surface of the GaN substrate restrictively. Namely, the mask limits the crystal growth face of the GaN substrate to a part of the surface of the GaN substrate.

Here, the low-index plane in the embodiment means an index plane having a structure that when the index plane is represented as {h k l m} (here, any of h, k, l and m is an integer number), each of absolute values of each of plane indices showing a crystal plane, namely, the Miller's index of h, k, l and m is not more than 3. For example, the low-index plane includes C-face, M-face, A-face, {10-1x}-face (here, x=1, 2 or 3), {11-2y}-face (here, y=1, 2 or 3).

Further, a GaN substrate can be used as the seed substrate, the GaN substrate being obtained by that a GaN ingot fabricated in the embodiment is cut or sliced. In this case, as described below, the GaN ingot fabricated in the embodiment has a polyhedron shape in which the low-index plane spontaneously formed by the crystal growth is included. The GaN ingot having the above-mentioned polyhedron shape is cut or sliced so that the GaN substrate can be obtained. The GaN substrate obtained can be used as a seed substrate for subsequent crystal growth. And, in this case, the GaN substrate can be used as the seed substrate by that the GaN substrate is cleaved or a mask is laminated thereon. Further, it is preferable that the seed substrate, if it has a circular shape, has a diameter of not less than 15 mm, and if it has a polygonal shape, has a circumscribed circle diameter of not less than 15 mm.

Step of Growing Crystal: S20

Next, only a main face of the seed substrate, namely, only a crystal growth face being the low-index plane of the seed substrate is exposed, and GaN single crystal is homoepitaxially grown on the crystal growth face. For example, Hydride Vapor Phase Epitaxy (HVPE) method can be used for the crystal growth. By using the HVPE method, a GaN ingot is formed on the crystal growth face of the seed substrate, the GaN ingot being surrounded by the low-index planes spontaneously formed by the crystal growth. Namely, due to the fact that the crystal growth is carried out by using the above-mentioned particular seed substrate, the growth of the GaN ingot which has the index planes including the Miller's index of not less than 4 on the seed substrate can be prevented, so that the GaN ingot obtained becomes a GaN ingot surrounded by the low-index plane.

Here, the maximum diameter of the GaN ingot to be formed is preferably not less than 15 mm, more preferably not less than 25 mm and further more preferably not less than 50 mm. And, the length of the GaN ingot, namely, the thickness of the single crystal in a crystal growth direction on the crystal growth face is preferably not less than 5 mm, more preferably not less than 10 mm, and further more preferably not less than 20 mm. And, the crystal growth speed at the crystal growth in the embodiment is preferably not less than 300 μm/h, more preferably not less than 500 μm/h, and further more preferably not less than 1000 μm/h.

And, in the embodiment, in case that the form of seed substrate is devised and the crystal growth direction is a C-axis direction, {10-1x}-face (here, x=1, 2 or 3) or {11-2y}-face (here, y=1, 2 or 3) can be formed on the side surface portions (namely, surfaces of which normals face to a direction different from the crystal growth direction) of the GaN ingot. Further, in the embodiment, in case that the form of seed substrate is devised and the crystal growth direction is a M-axis direction, {0001}-face or {10-1x}-face (here, x=1, 2 or 3), and A-face can be formed on the side surface portions of the GaN ingot. Furthermore, in the embodiment, in case that the form of seed substrate is devised and the crystal growth direction is a A-axis direction, {0001}-face or {11-2y}-face (here, y=1, 2 or 3), or M-face can be formed on the side surface portions of the GaN ingot.

The GaN ingot obtained as described above is a high quality GaN ingot in which occurrence of fine cracks at the crystal growth is prevented.

Step of Cutting or Slicing Ingot: S30

And, by cutting or slicing the GaN ingot obtained after the Step of growing crystal, a wafer (namely, a substrate) of group III nitride semiconductor single crystal can be fabricated. For example, by slicing the GaN ingot by a plane vertical to the crystal growth direction, the substrates having a quadrangular or hexagonal shape can be obtained. Further, the form of substrate can be adjusted by cleaving the periphery of the substrate. The area of main face of the substrate obtained by slicing the GaN ingot is preferably not less than 1 $cm^2$, and more preferably not less than 20 $cm^2$.

Since the group III nitride semiconductor single crystal substrate according to the embodiment obtained as described above is obtained by cutting the high quality GaN ingot, it becomes a high quality GaN substrate.

Knowledge Obtained by the Inventors

Further, it is based on the following knowledge obtained by the inventors that high quality group III nitride semiconductor single crystal substrate can be obtained by forming the GaN ingot surrounded by the low-index planes as described above.

Knowledge 1: Appearance of Habit Face

Generally, a substrate for device epitaxial growth of light emitting element such as Light Emitting Diode (LED), Laser Diode (LD) has often a circular shape or rectangular shape, so that a seed substrate having a circular shape or rectangular shape is used for the growth of ingot. However, in accordance with progress of the crystal growth, a particular crystal plane gradually progresses on the side surface of the grown crystal dependent on increase in thickness of the grown crystal. The crystal plane is called as "habit face".

In particular, a kind of the index plane which develops as the habit face varies dependent on symmetrical property of crystal structure of the crystal being grown, growth condition and the like. For example, if a circular GaN substrate having a hexagonal crystal structure (C-face is used as crystal growth face) is used as a seed substrate under a predetermined condition and the crystal growth is carried out on the crystal growth face along a C-axis direction, at six sites of the periphery of the substrate which had a circular shape before the crystal growth, flat {10-11}-faces begin to develop at even intervals. When the crystal growth is further continued, only six {10-11}-faces are formed as the side surfaces of the crystal. After that, when the crystal growth is further continued, straight trunk parts of {10-10}-face may be formed under the {10-11}-faces. Namely, in this case, single crystal having a hexagonal shape is formed. The inventors have obtained knowledge that there is the most energetically stable shape of the crystal shapes, the most stable shape being determined based on the crystal structure and growth condition, and the grown crystal formed by the crystal growth becomes to have a stable shape even if the seed substrate is used which has a shape different from the cross-section shape of the aforementioned shape.

Knowledge 2: Cracks Appearance Position

In the ingot described in "Knowledge 1", there are energetically unstable high-index planes between the {10-11}-faces which are six energetically stable low-index planes, and fine cracks occur in the vicinity of the high-index planes. This shows that the fine cracks to occur in the ingot obtained by the crystal growth occur in the vicinity of the side surface of ingot, instead of uniformly occurring in the whole periphery of the ingot.

Namely, it shows that the occurrence of fine cracks closely relates to existence of the energetically unstable high-index planes in the peripheral part of the ingot. Even if the detailed mechanism of occurrence of fine cracks is not obvious at the present, the inventors have obtained knowledge that the occurrence of fine cracks can be prevented when the crystal growth is carried out under the condition that the ingot surrounded by the low-index planes and having an energetically stable shape can be grown.

Further, as described above, the low-index planes in the hexagonal GaN of the embodiment include {0001}-face (namely C-face), {10-10}-face (namely M-face), {11-20}-face (namely A-face), {10-1x}-face (here, x=1, 2 or 3) and {11-2y}-face (here, y=1, 2 or 3). The inventors have studied about various index planes and have obtained knowledge that in case of the ingot having index planes in which x, y is not less than 4, cracks tend to easily occur in the vicinity of the index planes which include the Miller's index that x, y is not less than 4.

And, as the condition of growing the ingot surrounded by the low-index planes and having an energetically stable shape, particularly, the following method can be adopted. Namely, in case that as an ingot to be grown the GaN ingot having C-face as a main face is grown, a method which uses a seed substrate having a hexagonal shape and surrounded by any one of the above-mentioned low-index planes can be adopted. Alternatively, a method can be adopted, the method including that a mask having a window of a hexagonal shape or a rectangular shape whose four corners are cut on the cross, the shapes being smaller than a main face described below, is laminated on a seed substrate having the main face whose diameter is larger than that of the GaN ingot to be grown, and an epitaxial growth is carried out in the above-mentioned state.

Further, for example, in case that a mask having a fine hexagonal opening (for example, an opening having a diameter of μm order) is used, and GaN surrounded by the low-index planes (namely crystal surrounded by facet faces) is formed at the micro level, crystal (for example, a shape of six-sided pyramid is presented) surrounded by the low-index planes is naturally formed regardless of the shape of opening. This is due to the fact that the shape of crystal to be formed is subject to the crystal structure, the growth condition and the like, quite unlike a case that a large-size ingot is formed as the embodiment.

In more detail, as described below. First, crystal tries to take a form having a surface energy as small as possible at the same volume. Namely, in the crystal growth, it is more advantageous for the crystal to be surrounded by low-index planes which have the surface energy smaller than that of the high-index planes. Therefore, for example, in case that the crystal growth of GaN is carried out in a C-face direction, the shape of side surface of the crystal to be grown becomes a hexahedron, even if hypothetically a mask having a circular opening of μm order is laminated on a seed substrate and the crystal growth begins. Further, in particular, the index planes exposed in the side surface vary dependent on the crystal growth condition. This is due to the fact that a face having a growth speed relatively small develops at the crystal growth, and a kind of the index plane which becomes to have the growth speed smaller than those of the other index planes varies dependent on the growth condition.

For example, in case that the crystal growth of GaN is carried out in a C-face direction, the side surface of the ingot to be grown tends to be inclined from the normal direction of main face of the seed substrate under the condition that a V/III ratio is high, the growth temperature is low or partial pressure of $H_2$ is high. And, the reason why stress which causes an occurrence of cracks at the crystal growth of the micro level is not substantially accumulated in the grown crystal is that the size of the grown crystal is small and the surface area thereof is large in comparison with the volume thereof. Namely, the volume of crystal is directly proportional to the cube of the diameter thereof and simultaneously, the surface area is proportional to the square of the diameter thereof, so that the smaller the crystal size becomes, the larger the ratio of the surface area to the volume becomes, therefore, stress which causes an occurrence of cracks at the crystal growth is not substantially accumulated in the grown crystal. By this, in case of the crystal growth of the micro level, cracks do not substantially occur in the process of the crystal growth.

On the other hand, in case of a large-size crystal having a size of mm order, the shape of ingot finally obtained is subject to the growth condition, but the shape is not instantly formed. For example, in case of using a circular substrate as the seed substrate, the crystal which is grown in accordance with the advancement of crystal growth gradually becomes close to a hexagonal shape. However, even if the crystal growth is continued and thick crystal is grown, the high-index planes are hard to disappear, so that the cross-section shape of ingot obtained is almost circular.

In order to finally surround the side surface of ingot by facet faces of the low-index planes, depending on the indices of the facet faces, it is required for the crystal to be grown so as to have a thickness corresponding to almost the diameter of seed substrate. For example, in case of using the seed substrate of 2 inches in diameter, when the crystal is not grown so as to have a thickness of almost 2 inches, the ingot surrounded by the low-index planes can not be obtained. However, the inventors have obtained knowledge that if the crystal growth is continued while the high-index planes remain in the side face of ingot, cracks occur in the ingot during the crystal growth. And then, a relationship between the diameter of seed substrate and the thickness of ingot when cracks begin to occur in the ingot carrying out the crystal growth on the seed substrate has been investigated.

Figure 1B:
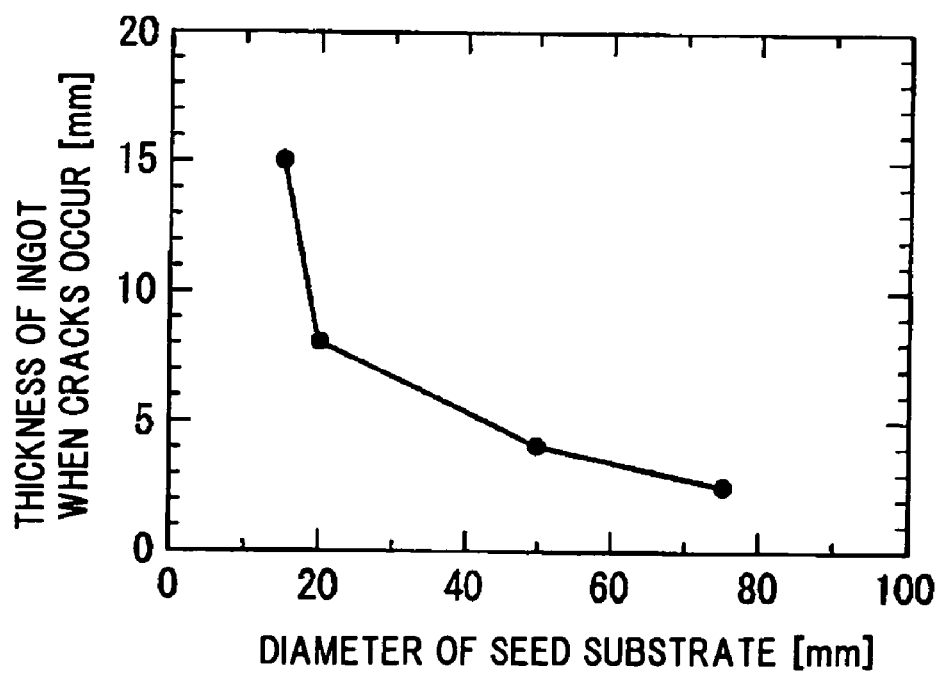
FIG. 1B is a graph schematically showing a relationship between a thickness of ingot when cracks begin to occur in the ingot carrying out the crystal growth on a seed substrate and a diameter of the seed substrate.

FIG. 1B is a graph schematically showing a relationship between a thickness of ingot when cracks begin to occur in the ingot carrying out the crystal growth on a seed substrate and a diameter of the seed substrate.

In case that the seed substrate has a circular shape, for example, if the seed substrate of 75 mm in diameter is used, when the grown crystal becomes to have a thickness of almost 2.5 mm, fine cracks have occurred in the grown crystal. In case of the thickness which caused the occurrence of cracks, although the {10-11}-faces gradually has been grown at six sites of periphery of the crystal, the high-index planes have considerably remained.

And, when the seed substrate has been decreased in diameter, the thickness when cracks begin to occur has been extremely increased. In case of using the seed substrate having a diameter of less than 15 mm, cracks did not have occurred in a range of the thickness investigated, namely, not more than 20 mm. In case of the seed substrate having a diameter of less than 15 mm, the high-index planes of the side surface of ingot have almost disappeared during the crystal growth, the ingot have changed to have a hexagonal shape whose periphery is surrounded by the {10-11}-faces.

On the other hand, in case that as the embodiment, in order to accelerate the growth of the low-index planes, a mask is disposed on the seed substrate so as to have a result that the cross-section shape in a cross-section parallel to the surface of seed substrate of the ingot to be grown becomes hexagonal, in a range of the thickness investigated, cracks did not have occurred at any diameter. Namely, knowledge has been obtained that it is relatively easy to thickly grow an ingot having a diameter of less than almost 15 mm without occurrence of cracks, but it is not so easy to grow an ingot having a diameter of more than 15 mm. Therefore, knowledge has been obtained that in order to form a large-size ingot without occurrence of cracks in the ingot, it is extremely effective to accelerate the formation of the low-index planes of ingot and to cause the high-index planes to disappear before cracks occur due to accumulation of stress to the ingot.

Knowledge 3: Crystal Growth Speed

In the embodiment, a seed substrate which comprises substantially single index plane is used. For example, in case that the crystal growth is carried out in a C-axis direction, the seed substrate which comprises only a C-face is used. In other word, the seed substrate does not comprise the other faces except for the C-face. And, in the embodiment, by applying the above-mentioned ingenuity to the seed substrate and further homoepitaxially growing GaN on the seed substrate, side surface facets are spontaneously formed on the side surface of ingot. This is different from, for example, a case that the facet faces are formed on the side surface of ingot by grinding the ingot, and the ingot can be prevent from the occurrence of grinding damage. Further, the facet faces are spontaneously formed, so that the surface accuracy of facet face formed is strictly accurate. Therefore, in the embodiment, the polycrystal does not adhere to the side surface of ingot and the like by the crystal growth. By this, in the embodiment, it is not needed to adopt such a process that after a processing which is applied to the ingot, the crystal growth is carried out by using the processed ingot.

Further, it can be also adopted that the ingot is once taken out from a HVPE furnace, the ingot having facet faces which are spontaneously formed on the side surface thereof, and the ingot taken out is used as a seed substrate for the subsequent crystal growth. Also in this case, if the corresponding seed substrate is used, a high-quality ingot can be obtained in comparison with a case that an ingot whose cross-section is circular is processed so as to have a polyhedron shape. Further, according to the embodiment, a high speed crystal growth can be realized. Generally, when the crystal growth speed is increased, namely, when degree of supersaturation is increased, the crystal obtained by the crystal growth is easily polycrystallized, but it was confirmed that according to the method of fabricating group III nitride semiconductor single crystal in the embodiment, abnormal occurrence of polycrystal is prevented.

Knowledge 4: Maximum External Diameter of Ingot

In the embodiment, the maximum external diameter of ingot obtained by the crystal growth is preferably not less than 15 mm, more preferably not less than 25 mm, and further more preferably not less than 50 mm. This is due to the fact that the larger the diameter of ingot is, the more the influence of peripheral portion of the ingot is reduced. Namely, the peripheral portion for the grown crystal is a portion that is often accompanied by disorder of the crystal growth condition, and in comparison with the other portions, defect density and remaining stress are easily increased. Therefore, even if the ingot is an ingot that is surrounded by the low-index planes, it is preferable that a percentage of the peripheral portion among the whole ingot is low.

Figure 1C:
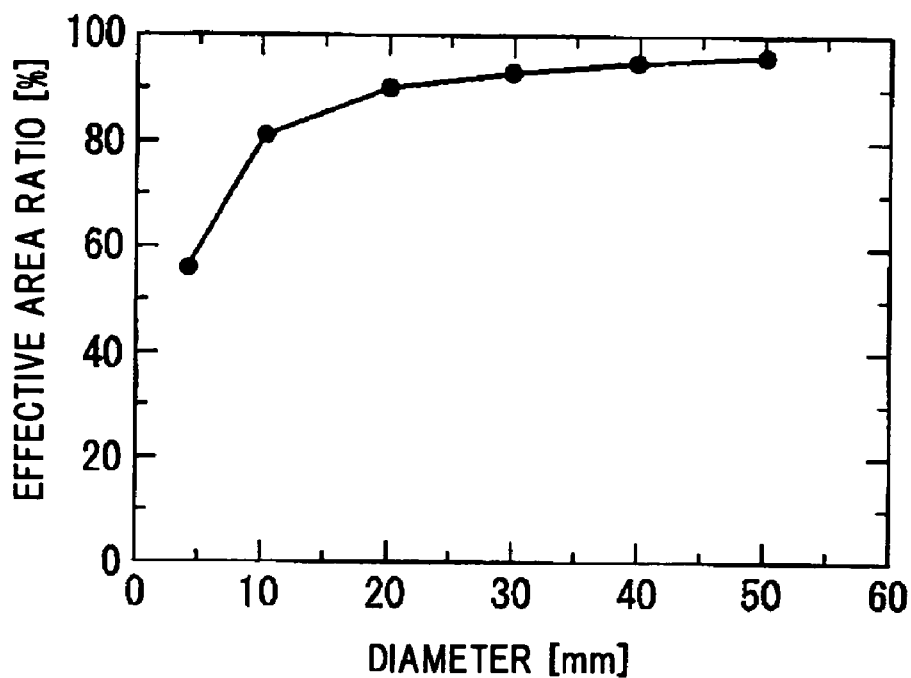
FIG. 1C is a graph schematically showing a relationship between a diameter of ingot and an effective area ratio.

FIG. 1C is a graph schematically showing a relationship between a diameter of ingot and an effective area ratio.

As shown in FIG. 1C, it is known that if the diameter of ingot is controlled to be not less than 15 mm, the effective area ratio becomes not less than 80%. Namely, the surface area of ingot is proportional to the square of the radius thereof and simultaneously, the peripheral length is proportional to the radius, so that the peripheral length per unit area is reduced inversely proportional to the radius of ingot. A width to be affected by the periphery is almost not more than 0.5 mm, while it is dependent on the crystal growth condition and the like. In this case, the inventors have obtained knowledge that the effective area ratio going far beyond 80% can be obtained by that the diameter of ingot is controlled to be not less than 15 mm. Here, the effective area ratio means a ratio of a high quality region which is not be affected by the peripheral portion.

Knowledge 5: Thickness of Ingot (Grown Crystal)

In the method of fabricating group III nitride semiconductor single crystal according to the embodiment, in order to improve crystallinity, it is preferable that the thickness of single crystal, namely, the thickness of ingot in a crystal growth direction is controlled to be not less than 5 mm, it is more preferable to be not less than 10 mm, and it is further more preferable to be not less than 20 mm. Namely, in the method of fabricating group III nitride semiconductor single crystal according to the embodiment, since the ingot is prevented from the adhesion of polycrystal during the crystal growth, pits and cracks due to the adhesion of polycrystal do not occur, so that the crystallinity can be monotonously improved in accordance with increase in the thickness.

Namely, while the degree of the improvement may be dependent on the crystal growth condition, the crystallinity of ingot obtained can be drastically improved by that the crystal growth is continuously carried out until the thickness of ingot becomes almost not less than 5 mm. For example, a relationship between a grown crystal thickness (hereinafter referred to as "an epitaxial growth thickness") and a dislocation density when GaN is homoepitaxially grown on a seed substrate having the dislocation density of $3 \times 10^6$ cm$^{-2}$ is shown.

Figure 1D:
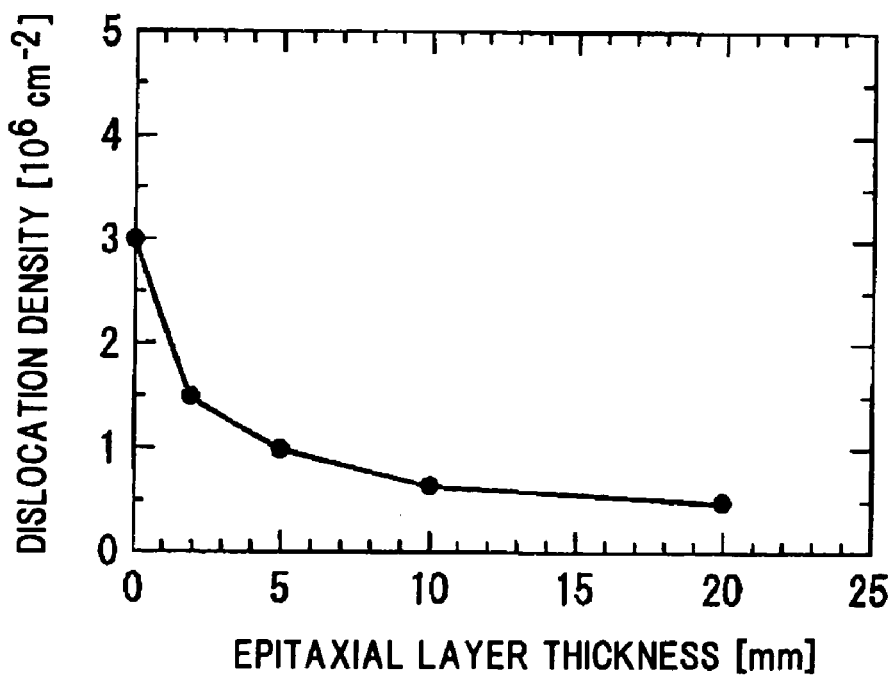
FIG. 1D is a graph schematically showing a relationship between an epitaxial growth thickness and a dislocation density when GaN is homoepitaxially grown on a seed substrate having the dislocation density of $3\times10^6$ cm$^{-2}$.

FIG. 1D is a graph schematically showing a relationship between the epitaxial growth thickness and the dislocation density when GaN is homoepitaxially grown on a seed substrate having the dislocation density of $3 \times 10^6$ cm$^{-2}$.

The dislocation density in the ingot was monotonously reduced in accordance with increase in the epitaxial growth thickness. For example, by that the epitaxial growth thickness is controlled to be not less than 5 mm, the dislocation density can be controlled to be not less than $1 \times 10^6$ cm$^{-2}$. Further, for writing use of optical disc, the dislocation density of less than $1 \times 10^6$ cm$^{-2}$ is required. And, based on that the epitaxial growth thickness is controlled to be not less than 5 mm, a plurality of the substrates can be obtained by that the ingot obtained is sliced.

Modification of Embodiment

The group III nitride semiconductor single crystal according to the embodiment is not limited to a crystal of GaN used in the embodiment, and the group III nitride semiconductor single crystal includes a crystal of group III nitride semiconductor such as aluminum nitride (AlN) or a mixed crystal of group III nitride semiconductor such as indium gallium nitride (InGaN), gallium aluminum nitride (AlGaN).

Further, the group III nitride semiconductor single crystal according to the embodiment was epitaxially grown by using the HVPE method, but the other methods such as a flux method, an ammonothermal method can be also used.

Advantages of Embodiment

According to the embodiment of the invention, a method of fabricating a group III nitride semiconductor single crystal is conducted such that a seed substrate for growing an ingot of group III nitride semiconductor single crystal is cleaved or a mask is laminated so as to form the ingot surrounded by low-index planes on the seed substrate. Therefore, occurrence of fine cracks in the ingot obtained can be significantly reduced and the high-quality and long-size ingot can be obtained. In addition, a high-quality group III nitride semiconductor substrate can be obtained by cutting or slicing the ingot.

EXAMPLE 1

FIGS. 2A to 2F schematically show the respective features in a flow of a method of fabricating a group III nitride semiconductor substrate in Example 1 according to the invention.

The group III nitride semiconductor substrate according to Example 1 was fabricated by forming a seed substrate based on cleaving a predetermined nitride semiconductor substrate and slicing the ingot obtained by that the group III nitride semiconductor was homoepitaxially grown along a C-face direction of the seed substrate.

Particularly, as shown in FIG. 2A, first, a circular GaN substrate 10 was prepared, the circular GaN substrate 10 comprising a front surface 10a which is a crystal growth face and a rear surface 10b which is located at the opposite side of the front surface 10a. Further, FIG. 2B is a transverse cross-sectional view of the circular GaN substrate 10 taken along the line A-A in FIG. 2A. And, the circular GaN substrate 10 has a diameter of 60 mm and a thickness of 0.5 mm, and the front surface 10a is a C-face. Next, the six sites of the periphery of circular GaN substrate 10 were cleaved in the M-faces. By this, a hexagonal GaN substrate 12 as shown in FIG. 2C was prepared as the seed substrate.

The hexagonal GaN substrate 12 was surrounded by side surfaces 12c of the M-face and has had a regular hexagonal shape of 60 mm in diameter. Further, FIG. 2D is a transverse cross-sectional view of the hexagonal GaN substrate 12 taken along the line B-B in FIG. 2C. While the hexagonal GaN substrate 12 are surrounded by a front surface 12a of the C-face, a rear surface 12b and a plurality of side surfaces 12c, substantially only the front surface 12a of the C-face becomes a crystal growth face.

Next, the hexagonal GaN substrate 12 was placed in a HVPE furnace and GaN was homoepitaxially grown on the front surface 12a of the hexagonal GaN substrate 12. As a material for the homoepitaxial growth gallium chloride (GaCl) and ammonia ($NH_3$) was used, and as a carrier gas nitrogen ($N_2$) gas was used. The homoepitaxial growth was carried out under atmospheric pressure, and the partial pressure of GaCl was set to 1.7 kPa and simultaneously the partial pressure of $NH_3$ was set to 10 kPa. Further, hydrogen ($H_2$) of 20 kPa in partial pressure was also added. And, the growth temperature of the homoepitaxial growth was set to 1050 degrees C.

The growth speed of the homoepitaxial growth under the above-mentioned condition was 400 μm/h. And, under the above-mentioned conditions the homoepitaxial growth of GaN on the hexagonal GaN substrate 12 was carried out for 24 hours. As a result, a ingot 14 of GaN shown in FIG. 2E was obtained. The ingot 14 had a thickness of almost 9.4 mm and a diameter of almost 60 mm.

Figure 2E:
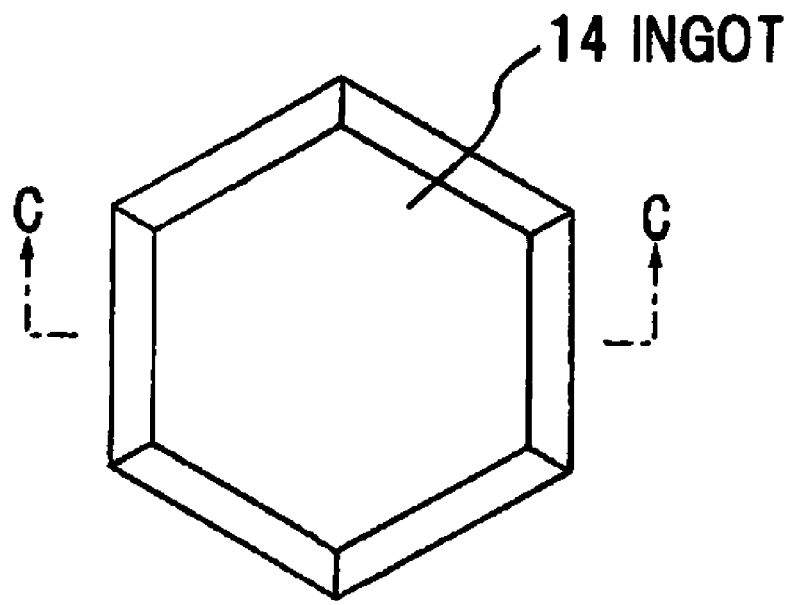
FIG. 2E is a plan view schematically showing an ingot used in Example 1 according to the invention.
Figure 2F:
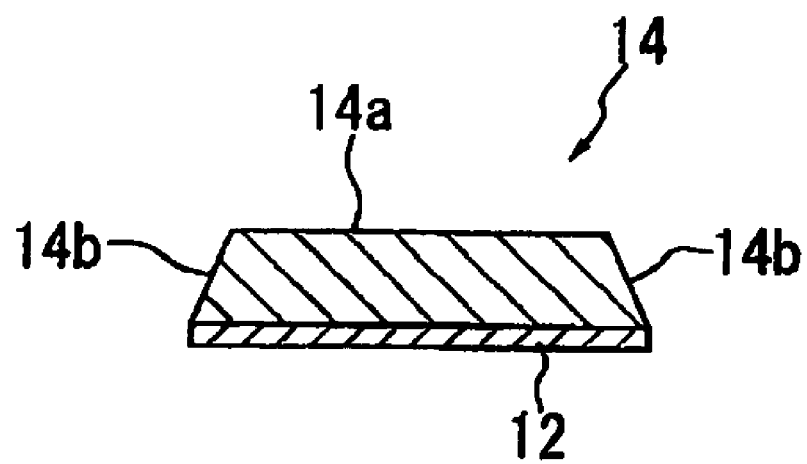
FIG. 2F is a transverse cross-sectional view taken along the line C-C in FIG. 2E.

FIG. 2F is a transverse cross-sectional view of the ingot 14 taken along the line C-C in FIG. 2E. The ingot 14 obtained in Example 1 comprises a front surface 14a which is located at the end and is formed of a flat C-face, and six side surfaces 14b which is located at the periphery of the front surface 14a and are formed of {10-11}-faces. Namely, by that GaN is epitaxially grown on the front surface 12a of the hexagonal GaN substrate 12, the ingot 14 was spontaneously formed on the hexagonal GaN substrate 12, the ingot 14 comprising a plurality of {10-11} planes whose normals are pointed in a different direction from the crystal growth direction of the homoepitaxial growth. And, cracks were not observed in the ingot 14, and it was shown that the ingot 14 of high quality can be fabricated at short times. By slicing the ingot 14, GaN substrates as high-quality group III nitride semiconductor substrates can be obtained.

EXAMPLE 2

Figure 3A:
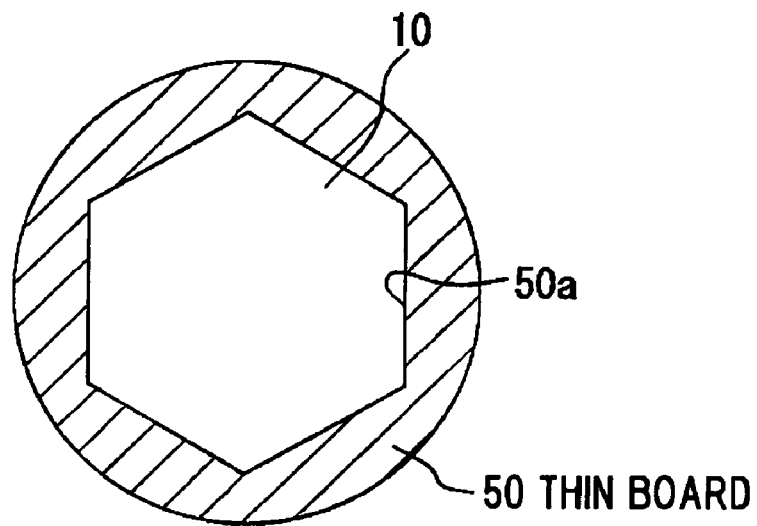
FIG. 3A is a plan view schematically showing a circular GaN substrate and a thin board used in Example 2 according to the invention.
Figure 3B:
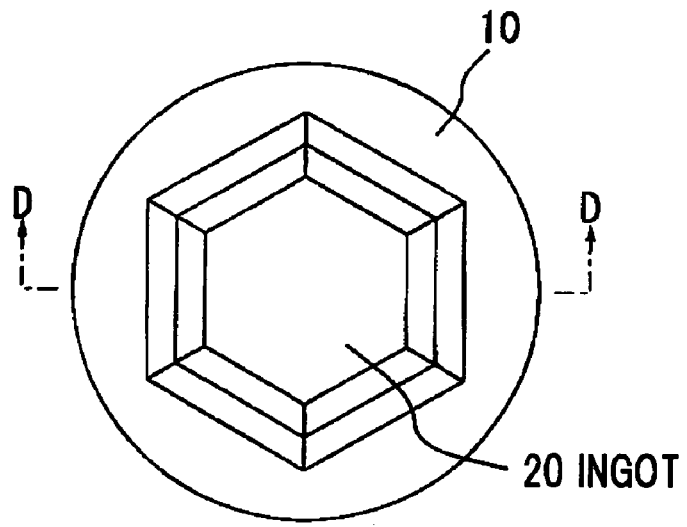
FIG. 3B is a plan view schematically showing an ingot on a circular GaN substrate used in Example 2 according to the invention.
Figure 3C:
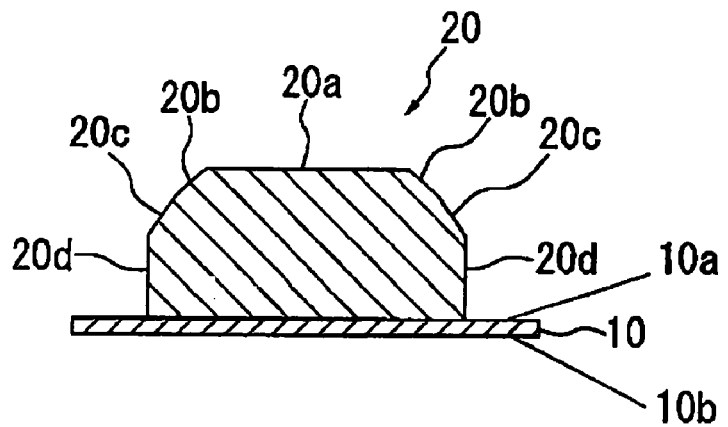
FIG. 3C is a transverse cross-sectional view taken along the line D-D in FIG. 3B.

FIGS. 3A to 3C schematically show the respective features in a flow of a method of fabricating a group III nitride semiconductor substrate in Example 2 according to the invention.

The group III nitride semiconductor substrate according to Example 2 was fabricated by that a thin board having an opening of a predetermined shape was laminated on a nitride semiconductor substrate as a seed substrate, remaining the state, group III nitride semiconductor was homoepitaxially grown along the C-axis direction of seed substrate so as to form an ingot, and the ingot obtained was sliced.

Particularly, first, a circular GaN substrate 10 shown in FIGS. 2A to 2B was prepared, the circular GaN substrate 10 comprising a front surface 10a which is a crystal growth face and a rear surface 10b which is located at the opposite side of the front surface 10a. And, the circular GaN substrate 10 has a diameter of 60 mm and a thickness of 0.5 mm, and the front surface 10a is a C-face. Next, a thin board 50 was prepared, the thin board 50 having a shape of circular substrate of 60 mm in diameter and simultaneously having an opening of regular hexagonal shape of 55 mm in diameter. The thin board 50 is a board formed of carbon and has a thickness of 0.5 mm. And, as shown in FIG. 3A, the thin board 50 was laminated on the circular GaN substrate 10. In this case, the thin board 50 was laminated on the circular GaN substrate 10 so that a side 50a of the hexagonal shape becomes parallel to the M-face of GaN of the circular GaN substrate 10.

Subsequently, the circular GaN substrate 10 on which the thin board 50 was laminated was placed in a HVPE furnace and GaN was homoepitaxially grown on the circular GaN substrate 10 through the opening of the thin board 50. As a material for the homoepitaxial growth gallium chloride (GaCl) and ammonia ($NH_3$) was used, and as a carrier gas nitrogen ($N_2$) gas was used. The homoepitaxial growth was carried out under atmospheric pressure, and the partial pressure of GaCl was set to 5 kPa and simultaneously the partial pressure of $NH_3$ was set to 30 kPa. Further, hydrogen ($H_2$) of 20 kPa in partial pressure was also added. And, the growth temperature of the homoepitaxial growth was set to 1050 degrees C.

The growth speed of the homoepitaxial growth under the above-mentioned condition was 1200 μm/h. And, under the above-mentioned conditions the homoepitaxial growth of GaN on the circular GaN substrate 10 was carried out for 18 hours. As a result, a ingot 20 of GaN shown in FIG. 3B was obtained. The ingot 20 had a thickness of almost 21 mm and a diameter of almost 55 mm.

FIG. 3C is a transverse cross-sectional view of the ingot 20 taken along the line D-D in FIG. 3B. Further, FIGS. 3B to 3C respectively show a state after the thin board 50 was eliminated. The ingot 20 obtained in Example 2 comprises a front surface 20a which is located at the end and is formed of a flat C-face, six side surfaces 20b which is located at the periphery of the front surface 20a and are formed of {10-12}-faces, six side surfaces 20c which are located at the periphery of the side surfaces 20b and are formed of {10-11}-faces, and six straight trunk parts 20d of the M-faces which is located so as to extend from a plurality of the side surface 20c to the circular GaN substrate 10. And, cracks were not observed in the ingot 20, and it was shown that the ingot 20 of high quality can be fabricated at short times. By slicing the ingot 20, GaN substrates as high-quality group III nitride semiconductor substrates can be obtained.

EXAMPLE 3

FIGS. 4A to 4E schematically show the respective features in a flow of a method of fabricating a group III nitride semiconductor substrate in Example 3 according to the invention.

The group III nitride semiconductor substrate according to Example 3 was fabricated by that an ingot 20 of GaN was fabricated by the same fabricating method as Example 2, the ingot 20 of GaN was sliced along the M-face so as to form GaN substrates, the GaN substrate formed was used as a seed substrate, a thin board having an opening of a predetermined shape was laminated on the seed substrate, remaining the state, group III nitride semiconductor was homoepitaxially grown along the M-axis direction of seed substrate so as to form an ingot, and the ingot obtained was sliced.

Figure 4A:
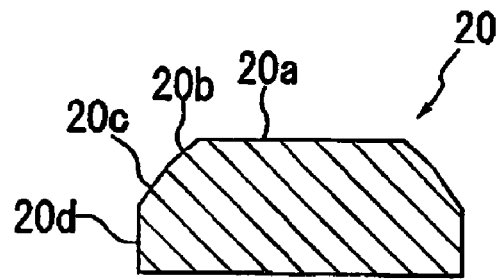
FIG. 4A is a transverse cross-sectional view schematically showing an ingot used in Example 3 according to the invention.
Figure 4B:
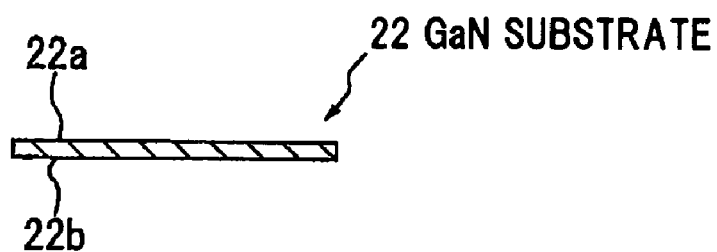
FIG. 4B is a transverse cross-sectional view schematically showing a GaN substrate used in Example 3 according to the invention.

Particularly, first, the ingot 20 fabricated in Example 2 shown in FIG. 4A was prepared. And, the ingot 20 was sliced along the M-face (namely, in FIG. 4A, the ingot 20 was sliced along the normal direction of a front surface 20a). Next, as shown in FIG. 4B, by grinding a front surface and a rear surface of the substrate obtained by the slicing, a GaN substrate 22 having a front surface 22a as the M-face was fabricated. Further, the front surface 22a is the crystal growth face and a surface located at the opposite side of the crystal growth face is a rear surface 22b.

Figure 4C:
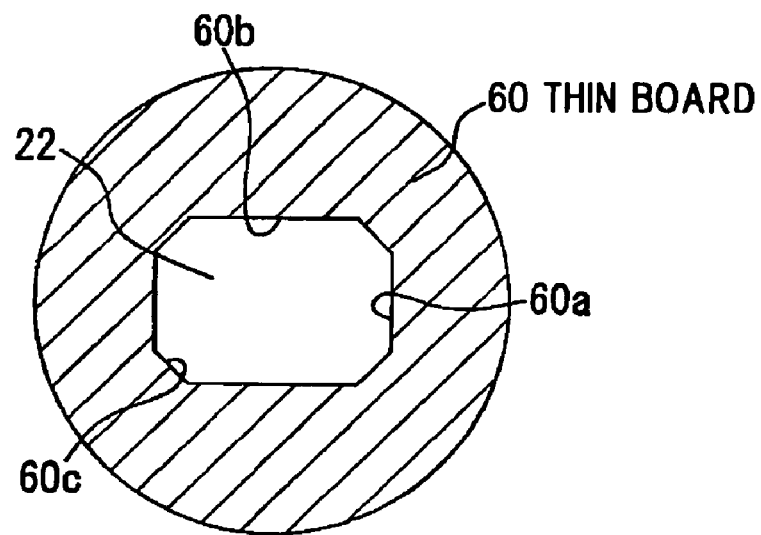
FIG. 4C is a plan view schematically showing a GaN substrate and a thin board used in Example 3 according to the invention.

Next, a thin board 60 was prepared, the thin board 60 formed of metal and having a window of a rectangular shape whose four corners are cut on the cross. The thin board 60 was formed of iridium so as to have a thickness of 0.5 mm. And, as shown in FIG. 4C, the thin board 60 was laminated on the front surface 22a of GaN substrate 22. Here, the thin board 60 was laminated on the GaN substrate 22 so that a short side 60a of the window of the thin board 60 becomes parallel to the A-face of the GaN substrate 22, a long side 60b of the window of the thin board 60 becomes parallel to the C-face of the GaN substrate 22 and an oblique side cut on the cross becomes parallel to the {11-22}-faces of the GaN substrate 22.

Subsequently, the GaN substrate 22 on which the thin board 60 was laminated was placed in a HVPE furnace and GaN was homoepitaxially grown on the GaN substrate 22 through the opening of the thin board 60. As a material for the homoepitaxial growth gallium chloride (GaCl) and ammonia (NH$_3$) was used, and as a carrier gas nitrogen (N$_2$) gas was used. The homoepitaxial growth was carried out under atmospheric pressure, and the partial pressure of GaCl was set to 3.3 kPa and simultaneously the partial pressure of NH$_3$ was set to 20 kPa. Further, hydrogen (H$_2$) of 20 kPa in partial pressure was also added. And, the growth temperature of the homoepitaxial growth was set to 1050 degrees C.

The growth speed of the homoepitaxial growth under the above-mentioned condition was 800 μm/h. And, under the above-mentioned conditions the homoepitaxial growth of GaN on the GaN substrate 22 was carried out for 12.5 hours. As a result, an ingot 30 of GaN shown in FIGS. 4D and 4E was obtained. The ingot 30 had a thickness of almost 10 mm.

Figure 4D:
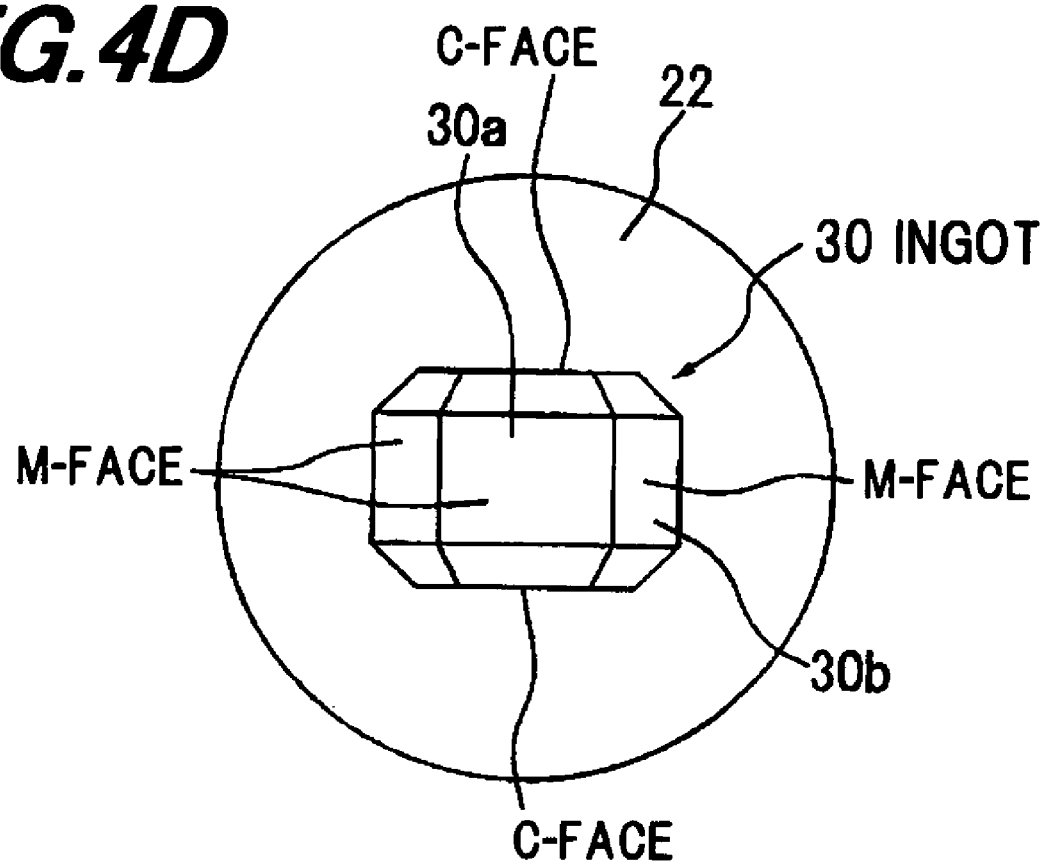
FIG. 4D is a plan view schematically showing an ingot on a GaN substrate used in Example 3 according to the invention.
Figure 4E:
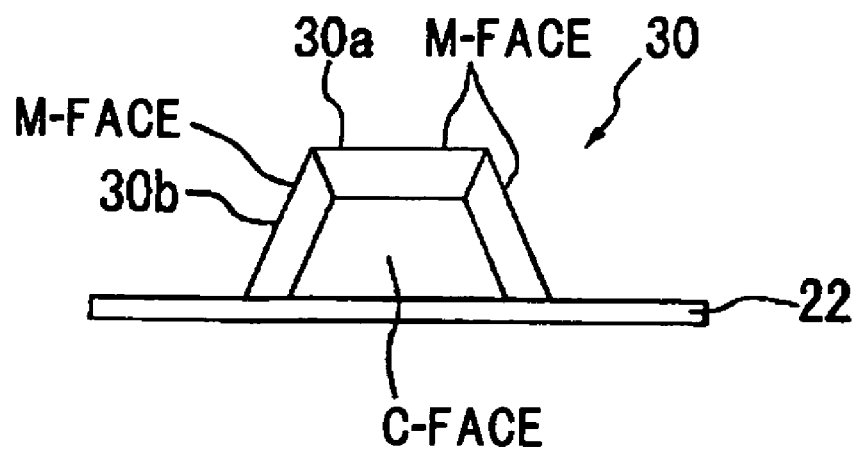
FIG. 4E is a side view schematically showing an ingot on a GaN substrate used in Example 3 according to the invention.

FIG. 4E is a side view of the ingot 30 shown in FIG. 4D. The ingot 30 obtained by Example 3 is formed in a trapezoidal shape, the trapezoidal shape obtained in case that a hexagonal column surrounded by the M-face and the C-face is cut in half lengthwise by a surface parallel to the M-face along the center axis (the C-axis) and is laid down, and the {10-11}-face was grown in the boundary line between the C-face and the M-face. Namely, in FIG. 4E, a front surface 30a at the end portion is the flat M-face and the side surface 30b is also the M-face. And, as shown in FIG. 4E, vertical faces located at the front and rear sides of the ingot 30 are the C-faces. And, cracks were not observed in the ingot 30, and it was shown that the ingot 30 of high quality can be fabricated at short times. By slicing the ingot 30, GaN substrates as high-quality group III nitride semiconductor substrates can be obtained.

EXAMPLE 4

FIGS. 5A to 5F schematically show the respective features in a flow of a method of fabricating a group III nitride semiconductor substrate in Example 4 according to the invention.

The group III nitride semiconductor substrate according to Example 4 was fabricated by that an ingot 20 of GaN was fabricated by the same fabricating method as Example 2, the ingot 20 of GaN was sliced along the A-face so as to form GaN substrates, the GaN substrate formed was cleaved, the substrate obtained was used as a seed substrate, group III nitride semiconductor was homoepitaxially grown along the A-axis direction of seed substrate so as to form an ingot, and the ingot obtained was sliced.

Figure 5A:
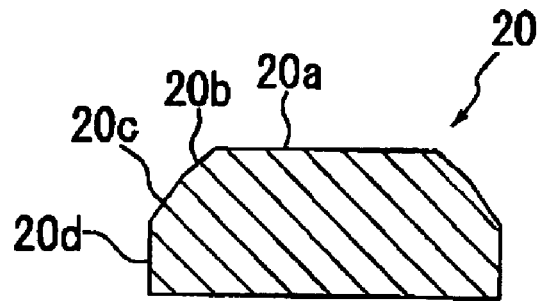
FIG. 5A is a transverse cross-sectional view schematically showing an ingot used in Example 4 according to the invention.
Figure 5B:
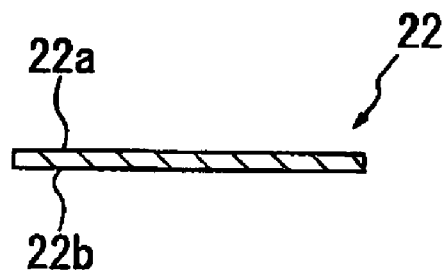
FIG. 5B is a transverse cross-sectional view schematically showing a GaN substrate used in Example 4 according to the invention.

Particularly, first, the ingot 20 fabricated in Example 2 shown in FIG. 5A was prepared. And, the ingot 20 was sliced along the A-face. Next, as shown in FIG. 5B, by grinding a front surface and a rear surface of the substrate obtained by the slicing, a GaN substrate 22 having a front surface 22a as the A-face was fabricated. Further, the front surface 22a is the crystal growth face and a surface located at the opposite side of the crystal growth face is a rear surface 22b.

Figure 5C:
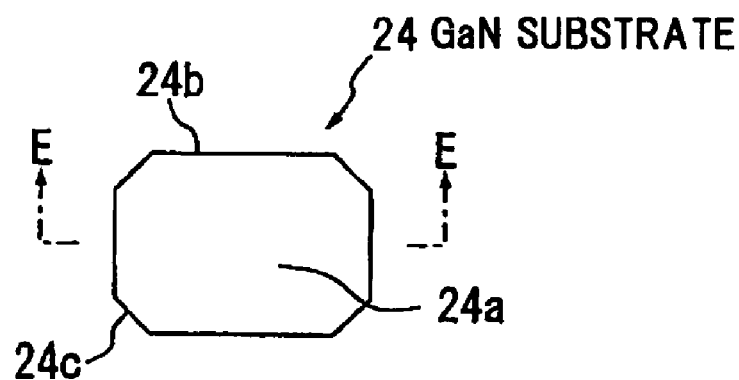
FIG. 5C is a plan view schematically showing a GaN substrate used in Example 4 according to the invention.
Figure 5D:
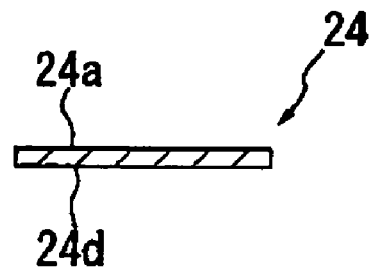
FIG. 5D is a transverse cross-sectional view taken along the line E-E in FIG. 5C.

Next, the periphery of GaN substrate 22 was cleaved at the C-face and the M-face so that a GaN substrate 24 was obtained, the GaN substrate 24 having a rectangular shape of 25 mm×20 mm surrounded by the C-face and the M-face as shown in FIGS. 5C and 5D. Further, FIG. 5D is a transverse cross-sectional view taken along the line E-E in FIG. 5C. A front surface 24a of the GaN substrate 22 is the A-face. And, sides 24b of the GaN substrate 22 are parallel to the C-face or the M-face, and sides 24c at four corners are parallel to the {10-11}-face. Further, a surface located at the opposite side of the front surface 24a is a rear surface 24d and the front surface 24a is set to the crystal growth face.

Subsequently, the GaN substrate 24 was placed in a HVPE furnace and GaN was homoepitaxially grown on the GaN substrate 24. As a material for the homoepitaxial growth gallium chloride (GaCl) and ammonia (NH$_3$) was used, and as a carrier gas nitrogen (N$_2$) gas was used. The homoepitaxial growth was carried out under atmospheric pressure, and the partial pressure of GaCl was set to 2.5 kPa and simultaneously the partial pressure of NH$_3$ was set to 15 kPa. Further, hydrogen (H$_2$) of 20 kPa in partial pressure was also added. And, the growth temperature of the homoepitaxial growth was set to 1050 degrees C.

The growth speed of the homoepitaxial growth under the above-mentioned condition was 600 μm/h. And, under the above-mentioned conditions the homoepitaxial growth of GaN on the GaN substrate 24 was carried out for 20 hours. As a result, an ingot 40 of GaN shown in FIGS. 5E and 5F was obtained. The ingot 40 had a thickness of almost 12 mm.

Figure 5E:
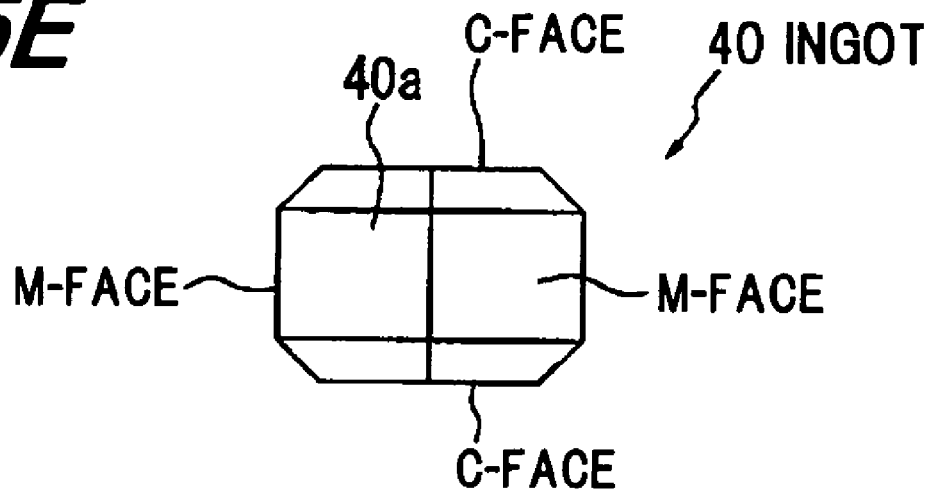
FIG. 5E is a plan view schematically showing an ingot on a GaN substrate used in Example 4 according to the invention.
Figure 5F:
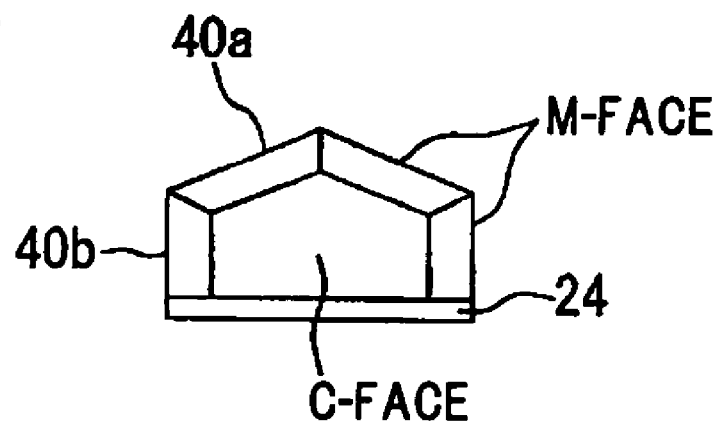
FIG. 5F is a side view schematically showing an ingot on a GaN substrate used in Example 4 according to the invention.

FIG. 5F is a side view of the ingot 40 shown in FIG. 5E. The ingot 40 obtained by Example 4 is formed in a trussed roof shape, the shape obtained in case that a hexagonal column surrounded by the M-face and the C-face is cut in half lengthwise by a surface parallel to the A-face along the center axis (the C-axis) and is laid down, and the {10-11}-face was grown in the boundary line between the C-face and the M-face. Namely, in FIG. 5F, a front surface 40a at the end portion is the M-face and the side surface 40b is also the M-face. And, as shown in FIG. 5F, vertical faces located at the front and rear sides of the ingot 40 are the C-faces. And, cracks were not observed in the ingot 40, and it was shown that the ingot 40 of high quality can be fabricated at short times. By slicing the ingot 40, GaN substrates as high-quality group III nitride semiconductor substrates can be obtained.

COMPARATIVE EXAMPLE

Figure 6A:
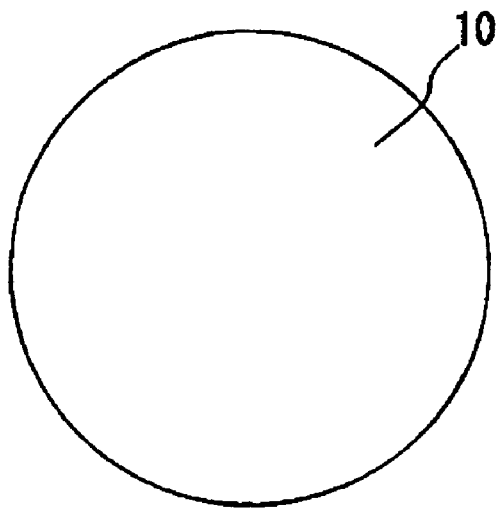
FIG. 6A is a plan view schematically showing a circular GaN substrate used in Comparative Example.
Figure 6B:
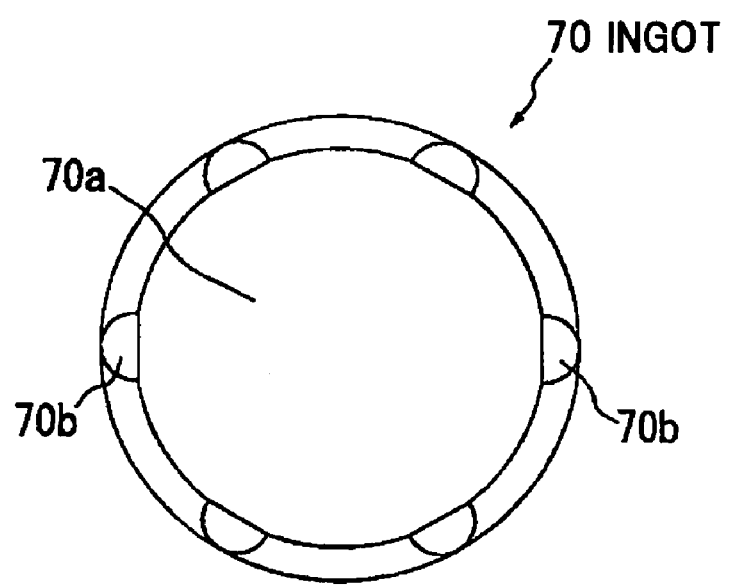
FIG. 6B is a plan view schematically showing an ingot on a circular GaN substrate used in Comparative Example.
Figure 6C:
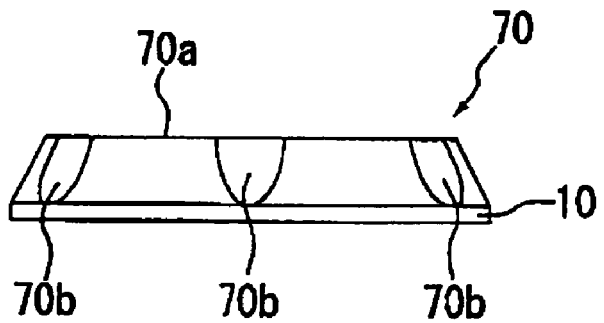
FIG. 6C is a side view schematically showing an ingot on a circular GaN substrate used in Comparative Example.

FIGS. 6A to 6C schematically show the respective features in a flow of a method of fabricating a group III nitride semiconductor substrate according to Comparative Example.

The group III nitride semiconductor substrate according to Comparative Example was fabricated by that a circular GaN substrate was used as a seed substrate, group III nitride semiconductor was homoepitaxially grown along the C-axis direction of the seed substrate so as to form an ingot, and the ingot obtained was sliced.

Particularly, first, a circular GaN substrate 10 shown in FIG. 6A was prepared as a seed substrate. And, the circular GaN substrate 10 has a diameter of 60 mm and a thickness of 0.5 mm, and the front surface of circular GaN substrate 10 is a C-face.

Next, the circular GaN substrate 10 was directly placed in a HVPE furnace and GaN was homoepitaxially grown on the circular GaN substrate 10. The same condition of homoepitaxial growth as that of Example 1 was used. As a result, an ingot 70 of GaN shown in FIG. 6B was obtained. The ingot 70 had a thickness of almost 9.4 mm and a diameter of almost 60 mm.

FIG. 6C is a side view of the ingot 70 shown in FIG. 6B. Referring to FIG. 6B, an end portion of the ingot 70, namely, a front surface 70a of the ingot 70 is the flat C-face and the periphery thereof was formed in almost a circular truncated cone shape. However, in Comparative Example, six regions 70b of the circular truncated cone shape portion have shapes that are scraped by the {10-11}-faces, and the shape of front surface 70a gradually becomes close to a hexagonal shape as becoming close to the side of front surface 70a from the circular GaN substrate 10. And, it was observed that a lot of fine cracks have occurred in the ingot 70, taking edge portions of the regions 70b as the starting point. Further, it was considered that the fine cracks have occurred during the homoepitaxial growth, and it was observed that the front surface 70a was markedly uneven due to the fact that the crystal growth was continuously carried out on the fine cracks after the fine cracks had occurred.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method of fabricating a group III nitride semiconductor single crystal, said method comprising:
    preparing a seed substrate which comprises group III nitride semiconductor and has a crystal growth face of single index plane; and
    epitaxially growing the group III nitride semiconductor single crystal on the crystal growth face,
    wherein the group III nitride semiconductor single crystal is epitaxially grown while being surrounded only by a plurality of crystal surfaces comprising low-index planes spontaneously formed, and
    wherein the low-index planes have a structure that each of plane indices showing a crystal plane is not more than 3.

2. The method of fabricating the group III nitride semiconductor single crystal according to claim 1, wherein the group III nitride semiconductor comprises a hexagonal nitride semiconductor, and
    wherein a low-index plane of the low-index planes has a structure that when the index plane is represented as {h k l m} where all of h, k, l and m are an integer number, each of absolute values of h, k, l and m is not more than 3.

3. The method of fabricating the group III nitride semiconductor single crystal according to claim 2, wherein the plurality of the crystal surfaces do not comprise high-index planes having a structure that any one of the plane indices showing the crystal plane is not less than 4.

4. The method of fabricating the group III nitride semiconductor single crystal according to claim 3, wherein the group III nitride semiconductor single crystal having a maximum external diameter of not less than 15 mm is epitaxially grown.

5. The method of fabricating the group III nitride semiconductor single crystal according to claim 4, wherein the group III nitride semiconductor single crystal is epitaxially grown by not less than 5 mm along a crystal growth direction.

6. The method of fabricating the group III nitride semiconductor single crystal according to claim 5, wherein the group III nitride semiconductor single crystal is epitaxially grown at a crystal growth speed of not less than 300 μm/h.

7. The method of fabricating the group III nitride semiconductor single crystal according to claim 6, wherein the seed substrate is prepared by that a periphery of the seed substrate is cleaved so that the seed substrate having sides parallel to the low-index plane is formed.

8. The method of fabricating the group III nitride semiconductor single crystal according to claim 6, wherein the seed substrate is prepared by that a mask is installed on the seed substrate so that the crystal growth face is limited to a part of a surface of the seed substrate.

9. A method of fabricating a group III nitride semiconductor single crystal substrate, said method comprising:
    cutting the group III nitride semiconductor single crystal fabricated by the method of fabricating the group III nitride semiconductor single crystal according to claim 1 by a plane vertical to a crystal growth direction so as to obtain the group III nitride semiconductor single crystal substrates.

10. The method of fabricating the group III nitride semiconductor single crystal substrate according to claim 9, wherein the group III nitride semiconductor single crystal substrate has a quadrangular or a hexagonal shape.

11. The method of fabricating the group III nitride semiconductor single crystal according to claim 1, wherein the low-index planes are spontaneously formed by a crystal growth.

12. The method of fabricating the group III nitride semiconductor single crystal according to claim 1, wherein the low-index planes have a surface energy smaller than that of high-index planes in the plurality of crystal surfaces.

13. The method of fabricating the group III nitride semiconductor single crystal according to claim 1, wherein the single crystal has a thickness substantially equal to a diameter of the seed substrate.

14. The method of fabricating the group III nitride semiconductor single crystal according to claim 1, wherein the seed substrate for growing an ingot of the group III nitride semiconductor single crystal is cleaved to form the ingot surrounded by the low-index planes on the seed substrate.

* * * * *